(12) United States Patent
Vrtis et al.

(10) Patent No.: US 12,402,659 B2
(45) Date of Patent: Sep. 2, 2025

(54) HEATER ASSEMBLY COMPRISING A PRINTED CIRCUIT BOARD

(71) Applicant: Philip Morris Products S.A., Neuchatel (CH)

(72) Inventors: Joan Kennetha Vrtis, Mesa, AZ (US); Jens Ausbuettel, Solingen (DE)

(73) Assignee: Philip Morris Products S.A., Neuchatel (CH)

( * ) Notice: Subject to any disclaimer, the term of this patent is extended or adjusted under 35 U.S.C. 154(b) by 1354 days.

(21) Appl. No.: 16/962,982

(22) PCT Filed: Jan. 18, 2019

(86) PCT No.: PCT/EP2019/051275
§ 371 (c)(1),
(2) Date: Jul. 17, 2020

(87) PCT Pub. No.: WO2019/141820
PCT Pub. Date: Jul. 25, 2019

(65) Prior Publication Data
US 2020/0352022 A1    Nov. 5, 2020

(30) Foreign Application Priority Data

Jan. 18, 2018 (EP) .................................... 18152400

(51) Int. Cl.
*A24F 40/46* (2020.01)
*A24F 40/20* (2020.01)
(Continued)

(52) U.S. Cl.
CPC ........... *A24F 40/46* (2020.01); *H05K 1/0212* (2013.01); *H05K 1/189* (2013.01); *A24F 40/20* (2020.01)

(58) Field of Classification Search
CPC ....... A24F 40/46; A24F 40/20; H05K 1/0212; H05K 1/189
See application file for complete search history.

(56) References Cited

U.S. PATENT DOCUMENTS

| 6,273,499 B1 | 8/2001 | Guyon |
| 7,544,066 B1 | 6/2009 | Lynch et al. |

(Continued)

FOREIGN PATENT DOCUMENTS

| CN | 203814582 U | 9/2014 |
| CN | 105326092 A | 2/2016 |

(Continued)

OTHER PUBLICATIONS

Translation for (WO 2014020953 A1) Shimizu (Year: 2023).*
(Continued)

*Primary Examiner* — Nathaniel E Wiehe
*Assistant Examiner* — Keith Brian Assante
(74) *Attorney, Agent, or Firm* — Oblon, McClelland, Maier & Neustadt, L.L.P.

(57) ABSTRACT

A heater assembly for an aerosol-generating device is provided, the heater assembly including an elongate electrical heater having a first end and a second end; and a printed circuit board including a main portion and a connection portion extending from the main portion, the connection portion overlapping the first end of the elongate electrical heater and being directly soldered to the first end of the elongate electrical heater, at least part of the connection portion being flexible, and the main portion being rigid.

12 Claims, 3 Drawing Sheets

(51) Int. Cl.
  *H05K 1/02* (2006.01)
  *H05K 1/18* (2006.01)

(56) References Cited

U.S. PATENT DOCUMENTS

| | | | |
|---|---|---|---|
| 7,914,348 B1 * | 3/2011 | Lin | H01R 13/2421 |
| | | | 439/700 |
| 2007/0162698 A1 | 7/2007 | Hsien et al. | |
| 2011/0290269 A1 | 12/2011 | Shimizu | |
| 2011/0304282 A1 | 12/2011 | Li et al. | |
| 2016/0286865 A1 | 10/2016 | King et al. | |
| 2016/0338412 A1 | 11/2016 | Monsees et al. | |
| 2016/0345631 A1 | 12/2016 | Monsees et al. | |
| 2016/0360794 A1 | 12/2016 | Li et al. | |
| 2016/0374400 A1 | 12/2016 | Monsees et al. | |
| 2017/0112196 A1 | 4/2017 | Sur et al. | |
| 2017/0208864 A1 | 7/2017 | Anderson, Jr. et al. | |
| 2017/0259170 A1 | 9/2017 | Bowen et al. | |

FOREIGN PATENT DOCUMENTS

| | | |
|---|---|---|
| CN | 105722417 A | 6/2016 |
| CN | 206275176 U | 6/2017 |
| CN | 206852033 U | 9/2018 |
| EP | 022685 B1 | 2/2016 |
| JP | H09251168 A | 9/1997 |
| JP | 11-168271 A | 6/1999 |
| JP | 2005340925 A | 12/2005 |
| JP | 2009086007 A | 4/2009 |
| JP | 2012-182390 A | 9/2012 |
| JP | 2013-150593 A | 8/2013 |
| JP | 2017-163975 A | 9/2017 |
| RU | 2 619 372 C2 | 5/2017 |
| RU | 2 636 917 C2 | 11/2017 |
| RU | 2 638 514 C2 | 12/2017 |
| TW | 201433269 A | 9/2014 |
| TW | 201620404 A | 6/2016 |
| TW | M548948 U | 9/2017 |
| WO | WO-2014020953 A1 * | 2/2014 ............ A24F 13/08 |
| WO | WO 2016/124552 A1 | 8/2016 |
| WO | WO 2017/163045 A1 | 9/2017 |

OTHER PUBLICATIONS

International Search Report and Written Opinion issued Apr. 12, 2019 in PCT/EP2019/051275 filed Jan. 18, 2019.
Combined Russian Office Action and Search Report issued on May 13, 2022 in Russian Patent Application No. 2020127347 (with English translation), citing references AA-AB and AO-AS therein, 12 pages.
Combined Office Action and Search Report issued on Feb. 21, 2023 in Taiwanese Patent Application No. 108101119 (with English translation), citing references 15-17 therein, 17 pages.
Office Action issued on Feb. 22, 2023 in Japanese Patent Application No. 2020-539250 (with English translation), citing references 1-3 and 18-21 therein, 11 pages.
Taiwanese Office Action and Search Report mailed on Mar. 28, 2024, issued in Taiwanese Patent Application No. 108101119 filed on Jan. 11, 2019, with English Translation, total 13 pages (citing documents 15 and 16, therein).
Korean Notice of Allowance mailed on Mar. 28, 2024 issued in Korean Patent Application No. 10-2020-7020990, with English Translation, total 3 pages (citing document 15 therein).
Japanese Office Action Dated Nov. 28, 2024, issued in corresponding Japanese Patent Application No. 2023-222579, with machine generated English Translation (8 pgs. total).

* cited by examiner

HEATER ASSEMBLY COMPRISING A PRINTED CIRCUIT BOARD

The present invention relates to a heater assembly for an aerosol-generating device. The present invention also relates to an aerosol-generating device comprising the heater assembly.

One type of aerosol-generating system is an electrically operated smoking system. Known handheld electrically operated smoking systems typically comprise an aerosol-generating device comprising a battery, control electronics and an electric heater for heating a smoking article designed specifically for use with the aerosol-generating device. In some examples, the smoking article comprises a plug of an aerosol-forming substrate, such as a tobacco plug, and the heater contained within the aerosol-generating device is inserted into the aerosol-forming substrate when the smoking article is inserted into the aerosol-generating device.

The control electronics are typically provided on a printed circuit board that is electrically connected to the heater by electrical wires extending between the printed circuit board and the heater. However, positioning the electrical wires between the printed circuit board and the heater and soldering the components together adds complexity to the manufacturing process. Furthermore, as a result of the relatively small scale of handheld aerosol-generating devices, the electrical wires typically have a small diameter. Therefore, if the wires are subjected to mechanical stresses during at least one of manufacture and use of the aerosol-generating device, one or more of the wires may break and prevent the supply of electrical power to the electric heater.

It would be desirable to provide a heater assembly for an aerosol-generating device that mitigates or overcomes at least some of the disadvantages with known heater assemblies for aerosol-generating devices.

According to a first aspect of the present invention there is provided a heater assembly for an aerosol-generating device. The heater assembly comprises an elongate electrical heater having a first end and a second end, and a printed circuit board comprising a connection portion. The connection portion overlaps the first end of the elongate electrical heater, and the connection portion is directly soldered to the first end of the elongate electrical heater.

Advantageously, directly soldering an elongate electrical heater to a printed circuit board eliminates the need to provide any intervening electrical connections, such as one or more electrical wires. Therefore, heater assemblies according to the present invention provide a more robust electrical connection between the electrical heater and the printed circuit board when compared to heater and printed circuit board arrangements in known aerosol-generating systems.

Advantageously, overlapping a connection portion of a printed circuit board with a first end of an elongate electrical heater may facilitate a desired orientation of the heater with respect to the printed circuit board. For example, overlapping the connection portion of the printed circuit board with the first end of the elongate electrical heater may facilitate a parallel orientation of the heater with respect to the connection portion.

Advantageously, overlapping a connection portion of a printed circuit board with a first end of an elongate electrical heater may increase the surface area of the soldered electrical connection between the heater and the connection portion. Advantageously, the increased surface area of the soldered electrical connection provides a more robust electrical connection between the electrical heater and the printed circuit board. Advantageously, the increased surface area of the soldered electrical connection may reduce the electrical resistance of the electrical connection between the electrical heater and the printed circuit board. Advantageously, reducing the electrical resistance of the soldered electrical connection may reduce the electrical power required to operate the electrical heater. Advantageously, reducing the electrical resistance of the soldered electrical connection may reduce undesired resistive heating of the soldered electrical connection.

Preferably, the connection portion of the printed circuit board may be substantially planar. Preferably, the connection portion extends substantially parallel to the first end of the elongate electrical heater. Advantageously, a parallel arrangement between the connection portion and the first end of the elongate electrical heater may facilitate the direct soldering of the connection portion to the first end of the elongate electrical heater.

The printed circuit board may be substantially planar. Preferably, the printed circuit board extends substantially parallel to the elongate electrical heater. Advantageously, a parallel arrangement between the printed circuit board and the elongate electrical heater may provide an elongate heater assembly. Advantageously, an elongate heater assembly may facilitate insertion of the heater assembly into a housing of an aerosol-generating device. For example, in embodiments in which an aerosol-generating device comprises a tubular housing, an elongate heater assembly may facilitate insertion of the heater assembly into the housing.

Preferably, the printed circuit board comprises a main portion, wherein the connection portion extends from the main portion. Advantageously, the main portion may form a portion of the printed circuit board on which one or more electrical components may be mounted. The heater assembly may comprise one or more electrical components mounted on the main portion of the printed circuit board. Suitable electrical components include, but are not limited to, resistors, capacitors, diodes, transistors, transformers, integrated circuits, and combinations thereof. The one or more electrical components may be surface mounted on the main portion of the printed circuit board. The one or more electrical components may be soldered to the main portion of the printed circuit board.

Preferably, at least part of the connection portion is flexible. Advantageously, a flexible part of the connection portion may accommodate relative movement between the elongate electrical heater and the main portion of the printed circuit board. Advantageously, accommodating relative movement between the elongate electrical heater and the main portion of the printed circuit board provides a more robust electrical connection between the electrical heater and the printed circuit board. Advantageously, accommodating relative movement between the elongate electrical heater and the main portion of the printed circuit board may facilitate correct positioning of the printed circuit board and the elongate electrical heater within a housing of an aerosol-generating device.

Preferably, the connection portion of the printed circuit board is formed integrally with the main portion of the printed circuit board. Advantageously, forming the connection portion integrally with the main portion eliminates the need for an electrical connection, such as a soldered connection, between the connection portion and the main portion. Advantageously, this eliminates the risk of a faulty electrical connection between the connection portion and the main portion.

Preferably, the main portion of the printed circuit board is substantially rigid. Advantageously, a rigid main portion of the printed circuit board may facilitate the mounting of one or more electrical components on the main portion of the printed circuit board. Advantageously, a rigid main portion of the printed circuit board may facilitate mounting of the heater assembly within a housing of an aerosol-generating device. For example, the rigid main portion of the printed circuit board may be secured to a housing of an aerosol-generating device. A rigid main portion of the printed circuit board may be secured to a housing of an aerosol-generating by an interference fit.

In embodiments in which at least part of the connection portion is flexible, the connection portion may comprise a flexible part depending from the main portion and a rigid part depending from the flexible part, wherein the first end of the elongate electrical heater is directly soldered to the rigid part of the connection portion. Advantageously, a rigid part of the connection portion may facilitate soldering of the first end of the elongate electrical heater to the connection portion.

Preferably, the flexible part of the connection portion comprises a first end and a second end, wherein the flexible part extends at its first end from the main portion of the printed circuit board, and wherein the rigid part of the connection portion extends from the second end of the flexible part.

Preferably, the rigid part of the connection portion is formed integrally with the flexible part of the connection portion. Advantageously, forming the rigid part integrally with the flexible part eliminates the need for an electrical connection, such as a soldered connection, between the rigid part and the flexible part. Advantageously, this eliminates the risk of a faulty electrical connection between the rigid part and the flexible part.

The elongate electrical heater may be formed from a resistive heating wire. The elongate electrical heater may be a coil-shaped. The elongate electrical heater may be configured to heat a fluid transport structure. The heater assembly may comprise a fluid transport structure, wherein the elongate electrical heater is arranged to heat the fluid transport structure. The fluid transport structure may comprise a wick. The elongate electrical heater may be coil-shaped, wherein the elongate electrical heater is coiled around the fluid transport structure.

The elongate electrical heater may be blade-shaped. The elongate electrical heater may be pin-shaped. The elongate electrical heater may be cone-shaped. Preferably, the elongate electrical heater is blade-shaped. Advantageously, a blade-shaped elongate electrical heater may facilitate direct soldering of the first end of the elongate electrical heater to the connection portion of the printed circuit board. For this reason, a blade-shaped elongate electrical heater may be particularly preferred in embodiments in which the connection portion of the printed circuit board is substantially planar.

The second end of the elongate electrical heater may form a tapered portion of the elongate electrical heater. Advantageously, the tapered portion may facilitate insertion of the second end of the elongate electrical heater into an aerosol-generating article during user of the heater assembly in an aerosol-generating device.

The elongate electrical heater may be a resistive heater.

The elongate electrical heater may comprise a resistive heating element. The elongate electrical heater may comprise an electrically insulating substrate, wherein the resistive heating element is provided on the electrically insulating substrate.

Preferably, the electrically insulating substrate is stable at an operating temperature of the elongate electrical heater. Preferably, the electrically insulating substrate is stable at temperatures of up to about 400 degrees Celsius, more preferably about 500 degrees Celsius, more preferably about 600 degrees Celsius, more preferably about 700 degrees Celsius, more preferably about 800 degrees Celsius. The operating temperature of the resistive heating element during use may be at least about 200 degrees Celsius. The operating temperature of the resistive heating element during use may be less than about 700 degrees Celsius. The operating temperature of the resistive heating element during use may be less than about 600 degrees Celsius. The operating temperature of the resistive heating element during use may be less than about 500 degrees Celsius. The operating temperature of the resistive heating element during use may be less than about 400 degrees Celsius.

The electrically insulating substrate may be a ceramic material such as Zirconia or Alumina. Preferably, the electrically insulating substrate has a thermal conductivity of less than or equal to about 2 Watts per metre Kelvin.

Suitable materials for forming the resistive heating element include but are not limited to: semiconductors such as doped ceramics, electrically "conductive" ceramics (such as, for example, molybdenum disilicide), carbon, graphite, metals, metal alloys and composite materials made of a ceramic material and a metallic material. Such composite materials may comprise doped or undoped ceramics. Examples of suitable doped ceramics include doped silicon carbides. Examples of suitable metals include titanium, zirconium, tantalum and metals from the platinum group. Examples of suitable metal alloys include stainless steel, nickel-, cobalt-, chromium-, aluminium- titanium- zirconium-, hafnium-, niobium-, molybdenum-, tantalum-, tungsten-, tin-, gallium-, manganese- and iron-containing alloys, and super-alloys based on nickel, iron, cobalt, stainless steel, Timetal® and iron-manganese-aluminium based alloys.

In some embodiments, the resistive heating element comprises one or more stamped portions of electrically resistive material, such as stainless steel. Alternatively, the resistive heating element may comprise a heating wire or filament, for example a Ni—Cr (Nickel-Chromium), platinum, tungsten or alloy wire.

Preferably, the elongate electrical heater comprises first and second electrical contacts positioned at the first end of the elongate electrical heater, wherein the first and second electrical contacts are electrically connected to the resistive heating element, and wherein the first and second electrical contacts are directly soldered to the connection portion of the printed circuit board. Preferably, the first and second electrical contacts may have at least one of a larger surface area and a smaller electrical resistance compared to the resistive heating element.

The first and second electrical contacts may be formed integrally with the resistive heating element. The first and second electrical contacts may be formed from the same material as the resistive heating element. The first and second electrical contacts may be formed from a different material compared to the resistive heating element.

The heater assembly may comprise a bushing, wherein the elongate electrical heater extends through the bushing. Advantageously, providing a heater assembly comprising a bushing may facilitate the installation of the heater assembly within a housing of an aerosol-generating device. That is, the bushing can be sized and shaped to fit within a housing of an aerosol-generating device. Preferably, the first end of the elongate electrical heater extends from a first side of the bushing and the second end of the elongate electrical heater extends from a second side of the bushing.

According to a second aspect of the present invention, there is provided an aerosol-generating device comprising a housing defining a cavity for receiving an aerosol-generating article, and a heater assembly according to the first aspect of the present invention, in accordance with any of the embodiments described herein. The heater assembly is disposed within the housing so that the second end of the elongate electrical heater extends into the cavity. The aerosol-generating device also comprises a power supply disposed within the housing and electrically connected to the printed circuit board of the heater assembly, wherein the printed circuit board is configured to supply electrical power from the power supply to the elongate electrical heater.

The heater assembly may be secured to the housing with at least one of an adhesive and an interference fit. The printed circuit board of the heater assembly may be received within the housing by an interference fit. In embodiments in which the printed circuit board is secured to the housing, preferably the printed circuit board comprises a rigid main portion, as described herein.

The heater assembly may comprise a bushing, as described herein. The bushing may be secured to the housing. The bushing may be adhered to the housing. The bushing may be received within the housing by an interference fit.

Preferably, the aerosol-generating device comprises a control circuit configured to control a supply of electrical power from the power supply to the elongate electrical heater. Preferably, the control circuit is disposed on the printed circuit board. In embodiments in which the printed circuit board comprises a main portion, preferably the control circuit is disposed on the main portion.

The power supply may be a DC voltage source. In preferred embodiments, the power supply is a battery. For example, the power supply may be a nickel-metal hydride battery, a nickel cadmium battery, or a lithium based battery, for example a lithium-cobalt, a lithium-iron-phosphate or a lithium-polymer battery. The power supply may alternatively be another form of charge storage device such as a capacitor. The power supply may require recharging and may have a capacity that allows for the storage of enough energy for use of the aerosol-generating device with one or more aerosol-generating articles.

Preferably, the aerosol-generating device comprises at least one air inlet. Preferably, the at least one air inlet is in fluid communication with an upstream end of the device cavity. Preferably, the elongate heater element extends into the device cavity from the upstream end of the device cavity.

The aerosol-generating device may comprise a sensor to detect air flow indicative of a consumer taking a puff. The sensor may be mounted on the printed circuit board. The air flow sensor may be an electro-mechanical device. The air flow sensor may be any of: a mechanical device, an optical device, an opto-mechanical device and a micro electro-mechanical systems (MEMS) based sensor. The aerosol-generating device may comprise a manually operable switch for a consumer to initiate a puff.

The aerosol-generating device may comprise a temperature sensor. The temperature sensor may be mounted on the printed circuit board. The temperature sensor may detect the temperature of the elongate electrical heater or the temperature of an aerosol-generating article received within the device cavity. The temperature sensor may be a thermistor. The temperature sensor may comprise a circuit configured to measure the resistivity of the elongate electrical heater and derive a temperature of the elongate electrical heater by comparing the measured resistivity to a calibrated curve of resistivity against temperature.

Advantageously, deriving the temperature of the elongate electrical heater may facilitate control of the temperature to which the elongate electrical heater is heated during use. The aerosol-generating device may be configured to adjust a supply of electrical power to the elongate electrical heater in response to a change in the measured resistivity of the elongate electrical heater.

Advantageously, deriving the temperature of the elongate electrical heater may facilitate puff detection. For example, a measured drop in the temperature of the elongate electrical heater may correspond to a user puffing or drawing on the aerosol-generating device.

Preferably, the aerosol-generating device comprises an indicator for indicating when the elongate electrical heater is activated. The indicator may comprise a light, activated when the elongate electrical heater is activated. The indicator may be mounted on the printed circuit board.

The aerosol-generating device may comprise at least one of an external plug or socket and at least one external electrical contact allowing the aerosol-generating device to be connected to another electrical device. For example, the aerosol-generating device may comprise a USB plug or a USB socket to allow connection of the aerosol-generating device to another USB enabled device. For example, the USB plug or socket may allow connection of the aerosol-generating device to a USB charging device to charge a rechargeable power supply within the aerosol-generating device. The USB plug or socket may additionally, or alternatively, support the transfer of data to or from, or both to and from, the aerosol-generating device. Additionally, or alternatively, the aerosol-generating device may be connected to a computer to transfer data to the device, such as new heating profiles for new aerosol-generating articles.

In those embodiments in which the aerosol-generating device comprises a USB plug or socket, the aerosol-generating device may further comprise a removable cover that covers the USB plug or socket when not in use. In embodiments in which the USB plug or socket is a USB plug, the USB plug may additionally or alternatively be selectively retractable within the device.

According to a third aspect of the present invention, there is provided an aerosol-generating system comprising an aerosol-generating device according to the second aspect of the present invention, in accordance with any of the embodiments described herein, and an aerosol-generating article comprising an aerosol-forming substrate.

As used herein, the term "aerosol-generating article" refers to an article comprising an aerosol-forming substrate that, when heated, releases volatile compounds that can form an aerosol.

The aerosol-forming substrate may comprise a plug of tobacco. The tobacco plug may comprise one or more of: powder, granules, pellets, shreds, spaghettis, strips or sheets containing one or more of: tobacco leaf, fragments of tobacco ribs, reconstituted tobacco, homogenised tobacco, extruded tobacco and expanded tobacco. Optionally, the tobacco plug may contain additional tobacco or non-tobacco volatile flavour compounds, to be released upon heating of the tobacco plug. Optionally, the tobacco plug may also contain capsules that, for example, include the additional tobacco or non-tobacco volatile flavour compounds. Such capsules may melt during heating of the tobacco plug. Alternatively, or in addition, such capsules may be crushed prior to, during, or after heating of the tobacco plug.

Where the tobacco plug comprises homogenised tobacco material, the homogenised tobacco material may be formed by agglomerating particulate tobacco. The homogenised tobacco material may be in the form of a sheet. The homogenised tobacco material may have an aerosol-former content of greater than 5 percent on a dry weight basis. The homogenised tobacco material may alternatively have an aerosol former content of between 5 percent and 30 percent by weight on a dry weight basis. Sheets of homogenised tobacco material may be formed by agglomerating particulate tobacco obtained by grinding or otherwise comminuting one or both of tobacco leaf lamina and tobacco leaf stems; alternatively, or in addition, sheets of homogenised tobacco material may comprise one or more of tobacco dust, tobacco fines and other particulate tobacco by-products formed during, for example, the treating, handling and shipping of tobacco. Sheets of homogenised tobacco material may comprise one or more intrinsic binders, that is tobacco endogenous binders, one or more extrinsic binders, that is tobacco exogenous binders, or a combination thereof to help agglomerate the particulate tobacco. Alternatively, or in addition, sheets of homogenised tobacco material may comprise other additives including, but not limited to, tobacco and non-tobacco fibres, aerosol-formers, humectants, plasticisers, flavourants, fillers, aqueous and non-aqueous solvents and combinations thereof. Sheets of homogenised tobacco material are preferably formed by a casting process of the type generally comprising casting a slurry comprising particulate tobacco and one or more binders onto a conveyor belt or other support surface, drying the cast slurry to form a sheet of homogenised tobacco material and removing the sheet of homogenised tobacco material from the support surface.

The aerosol-generating article may have a total length of between approximately 30 millimetres and approximately 100 millimetres. The aerosol-generating article may have an external diameter of between approximately 5 millimetres and approximately 13 millimetres.

The aerosol-generating article may comprise a mouthpiece positioned downstream of the tobacco plug. The mouthpiece may be located at a downstream end of the aerosol-generating article. The mouthpiece may be a cellulose acetate filter plug. Preferably, the mouthpiece is approximately 7 millimetres in length, but can have a length of between approximately 5 millimetres to approximately 10 millimetres.

The tobacco plug may have a length of approximately 10 millimetres. The tobacco plug may have a length of approximately 12 millimetres.

The diameter of the tobacco plug may be between approximately 5 millimetres and approximately 12 millimetres.

In a preferred embodiment, the aerosol-generating article has a total length of between approximately 40 millimetres and approximately 50 millimetres. Preferably, the aerosol-generating article has a total length of approximately 45 millimetres. Preferably, the aerosol-generating article has an external diameter of approximately 7.2 millimetres.

The invention will now be further described, by way of example only, with reference to the accompanying drawings in which.

Figure 1:
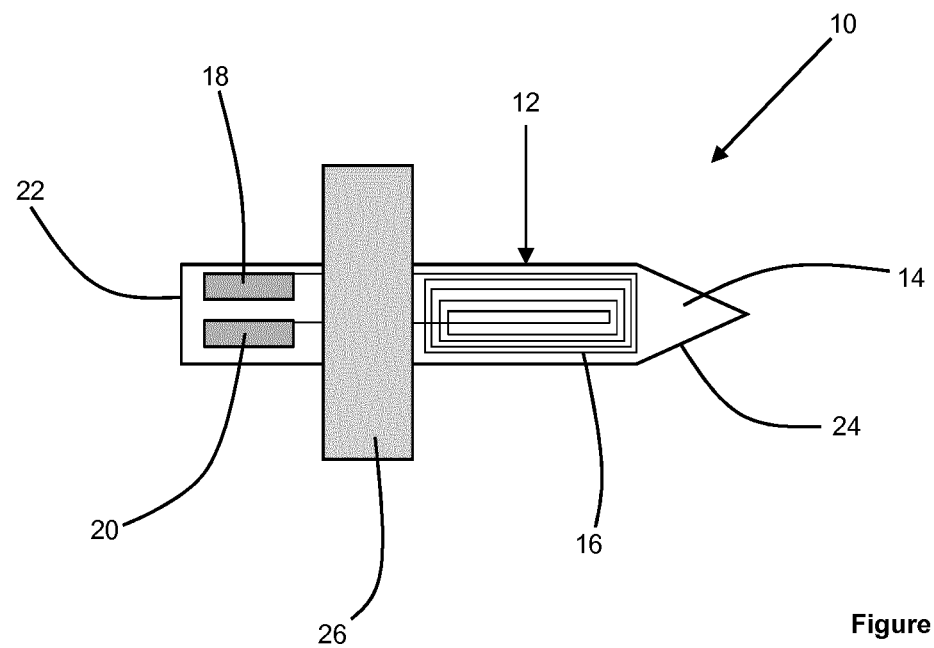
FIG. 1 shows a plan view of a heater sub-assembly.

FIG. 1 shows a plan view of a heater sub-assembly 10 comprising an elongate electrical heater 12. The elongate electrical heater 12 comprise an electrically insulating substrate 14 and a resistive heating element 16 disposed on the substrate 14. First and second electrical contacts 18, 20 are also disposed on the substrate 14, wherein the first and second electrical contacts 18, 20 are electrically connected to the resistive heating element 16. The elongate electrical heater 12 comprises a first end 22 at which the first and second electrical contacts 18, 20 are disposed. The elongate electrical heater 12 also comprise a second end 24 at which the resistive heating element 16 is disposed. The second end 24 of the elongate electrical heater 12 is tapered to facilitate insertion of the elongate electrical heater 12 into an aerosol-generating article.

The heater sub-assembly 10 also comprises a bushing 26 through which the elongate electrical heater 12 extends.

Figure 2:
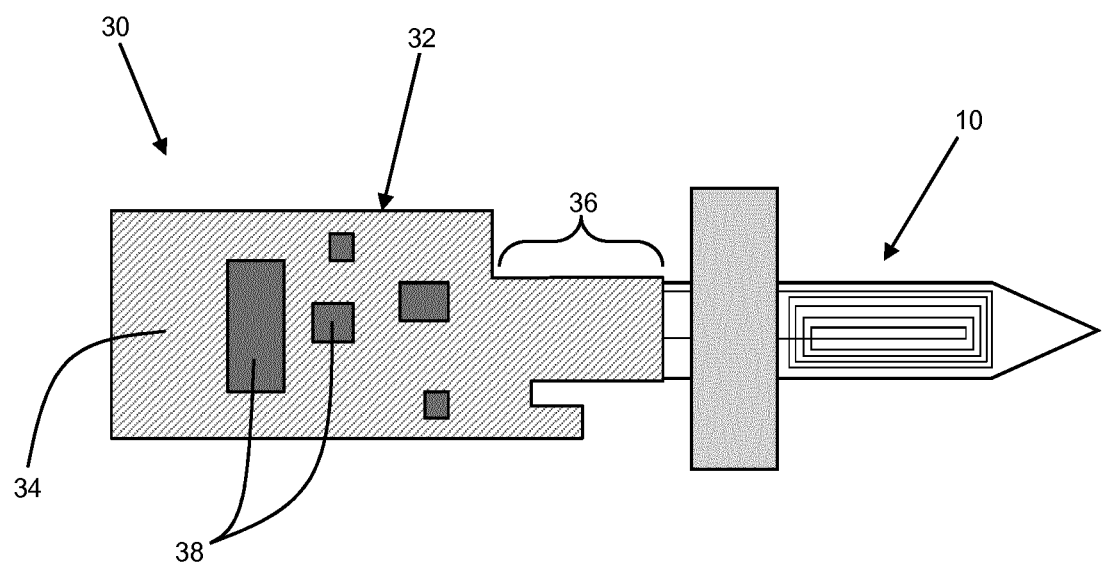
FIG. 2 shows a plan view of a heater assembly according to an embodiment of the present invention and comprising the heater sub-assembly of FIG. 1.

FIG. 2 shows a plan view of a heater assembly 30 according to an embodiment of the present invention. The heater assembly 30 comprises the heater sub-assembly 10 of FIG. 1. The heater assembly 30 also includes a printed circuit board 32 comprising a main portion 34 and a connection portion 36 extending from an end of the main portion 34. The connection portion 36 is formed integrally with main portion 34. The heater assembly 30 also comprises a plurality of electrical components 38 mounted on a surface of the main portion 34 of the printed circuit board 32.

Figure 3:
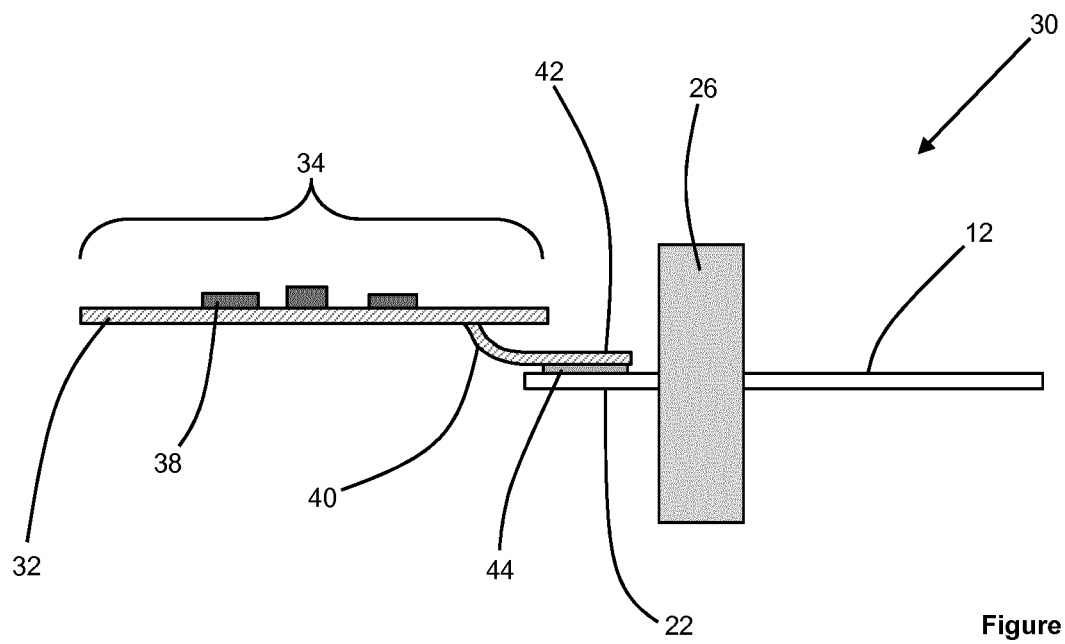
FIG. 3 shows a side view of the heater assembly of FIG. 2.

FIG. 3 shows a side view of the heater assembly 30. The main portion 34 of the printed circuit board 32 is rigid and supports the electrical components 38 mounted thereon. The connection portion 36 of the printed circuit board 32 comprises a flexible part 40 and a rigid part 42. The rigid part 42 of the connection portion 36 is directly soldered at a solder joint 44 to the first and second electrical contacts 18, 20 at the first end 22 of the elongate heater element 12. The flexible part 40 and the rigid part 42 are formed integrally with each other. Advantageously, the flexible part 40 accommodates relative movement between the elongate electrical heater 12 and the main portion 34 of the printed circuit board 32, for example during insertion of the heater assembly 30 into a housing of an aerosol-generating device.

Figure 4:
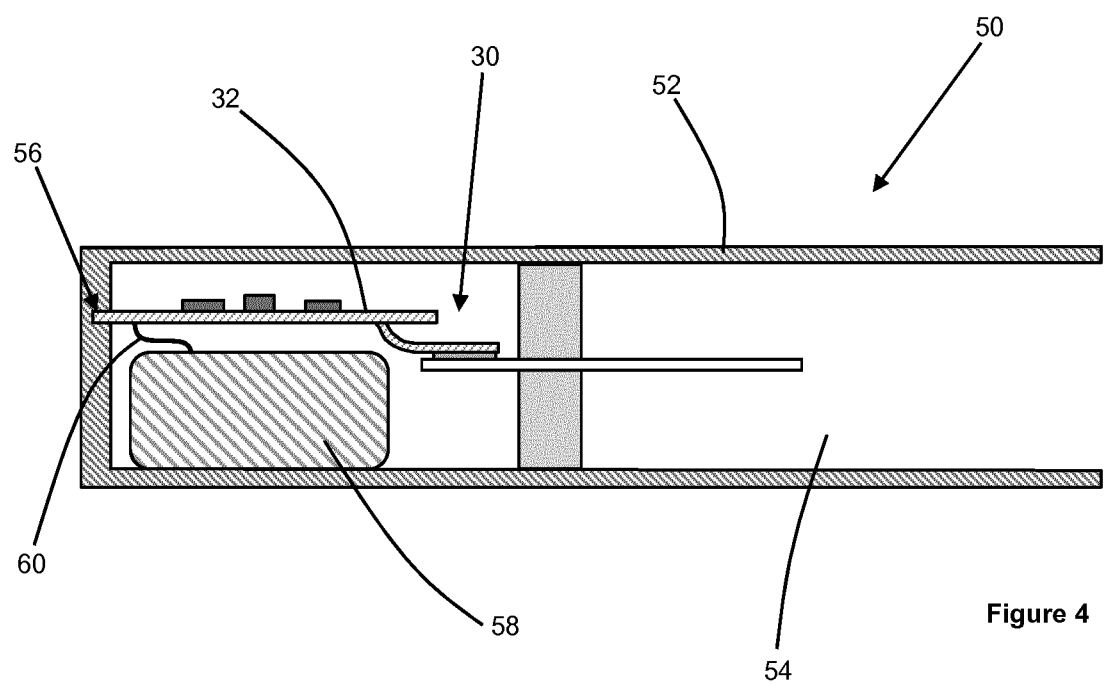
FIG. 4 shows a cross-sectional view of an aerosol-generating device comprising the heater assembly of FIGS. 2 and 3.

FIG. 4 shows a cross-sectional view of an aerosol-generating device 50 comprising the heater assembly 30. The aerosol-generating device 50 comprises a housing 52 defining a cavity 54 for receiving an aerosol-generating article. The heater assembly 30 is positioned within the housing 52 and retained within the housing by an interference fit. Specifically, the bushing 26 is received within the housing 52 by an interference fit, and the main portion 34 of the printed circuit board 32 is received by an interference fit within a slot 56 formed within the housing 52.

The aerosol-generating device 50 also comprises a power supply 58 in the form of a rechargeable battery positioned within the housing 52. The power supply 58 is electrically connected to the printed circuit board 32 by an electrical connector 60. During use, a control circuit comprising at least some of the electrical components 38 on the printed circuit board 32 controls a supply of electrical power from the power supply 58 to the resistive heating portion 16 of the elongate electrical heater 12.

Figure 5:
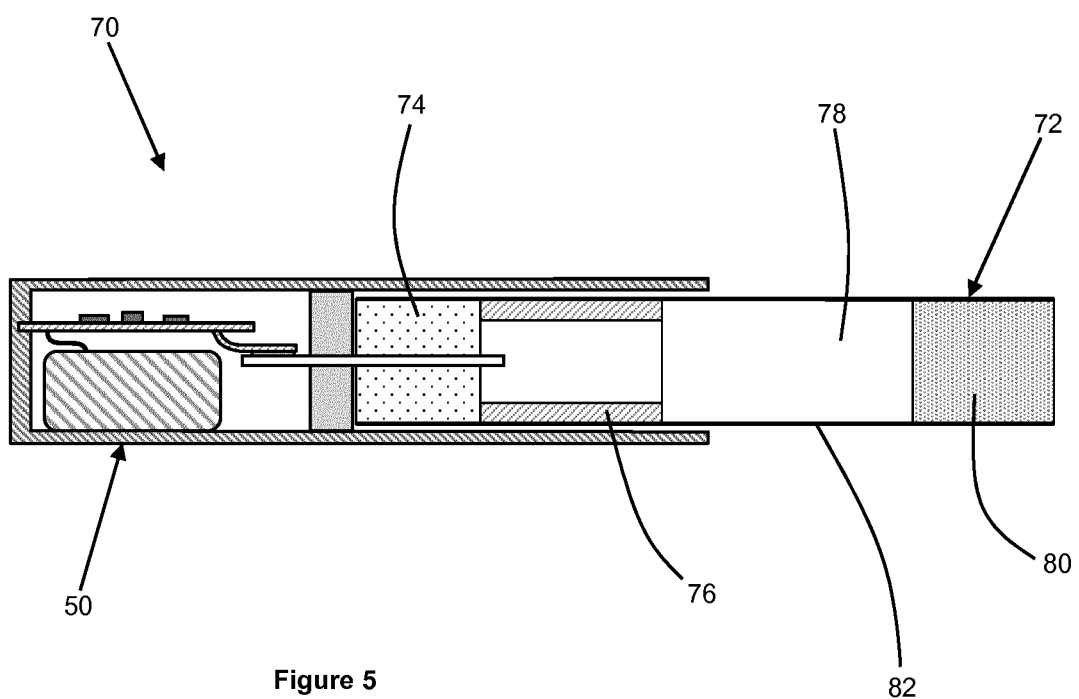
FIG. 5 shows a cross-sectional view of an aerosol-generating system comprising the aerosol-generating device of FIG. 4.

FIG. 5 shows a cross-sectional view of an aerosol-generating system 70 comprising the aerosol-generating device 50 of FIG. 4 and an aerosol-generating article 72 removably received within the cavity 54. The aerosol-generating article 72 comprises an aerosol-forming substrate 74 in the form of a tobacco plug, a hollow acetate tube 76, a polymeric filter 78, a mouthpiece 80 and an outer wrapper 82. When the aerosol-generating article 72 is received within the cavity 54 of the aerosol-generating device 50, the elongate electrical heater 12 of the heater assembly 30 is received within the tobacco plug. During use, the elongate electrical heater 12 heats the tobacco plug to generate an aerosol.

The invention claimed is:

1. A heater assembly for an aerosol-generating device, the heater assembly comprising:
    an elongate electrical heater having a first end and a second end, the elongate electrical heater being blade-shaped; and
    a printed circuit board comprising a main portion and a connection portion extending from the main portion,
    wherein the connection portion overlaps the first end of the elongate electrical heater,
    wherein the connection portion is directly soldered to the first end of the elongate electrical heater,
    wherein at least part of the connection portion is flexible, and
    wherein the main portion is rigid.

2. The heater assembly according to claim 1, wherein the printed circuit board is planar and extends parallel to the elongate electrical heater.

3. The heater assembly according to claim 1, wherein the connection portion is formed integrally with the main portion.

4. The heater assembly according to claim 1,
    wherein the connection portion comprises a flexible part depending from the main portion and a rigid part depending from the flexible part, and
    wherein the first end of the elongate electrical heater is directly soldered to the rigid part of the connection portion.

5. The heater assembly according to claim 4, wherein the rigid part of the connection portion is formed integrally with the flexible part of the connection portion.

6. The heater assembly according to claim 1, wherein the elongate electrical heater comprises a resistive heating element.

7. The heater assembly according to claim 6,
    wherein the elongate electrical heater further comprises first and second electrical contacts disposed at the first end of the elongate electrical heater,
    wherein the first and the second electrical contacts are electrically connected to the resistive heating element, and
    wherein the first and the second electrical contacts are directly soldered to the connection portion of the printed circuit board.

8. The heater assembly according to claim 1, further comprising a bushing, wherein the elongate electrical heater extends through the bushing.

9. The heater assembly according to claim 8,
    wherein the first end of the elongate electrical heater extends from a first side of the bushing, and
    wherein the second end of the elongate electrical heater extends from a second side of the bushing.

10. An aerosol-generating device, comprising:
    a housing defining a cavity configured to receive an aerosol-generating article;
    a heater assembly according to claim 1, wherein the heater assembly is disposed within the housing such that the second end of the elongate electrical heater extends into the cavity; and
    a power supply disposed within the housing and electrically connected to the printed circuit board of the heater assembly, wherein the printed circuit boarded is configured to supply electrical power from the power supply to the elongate electrical heater.

11. The aerosol-generating device according to claim 10, wherein the printed circuit board of the heater assembly is received within the housing by an interference fit.

12. An aerosol-generating system, comprising:
    an aerosol-generating device according to claim 10; and
    an aerosol-generating article comprising an aerosol-forming substrate.

* * * * *